United States Patent
Shanel

(10) Patent No.: US 9,595,359 B2
(45) Date of Patent: Mar. 14, 2017

(54) MAGNETIC LENS FOR FOCUSING A BEAM OF CHARGED PARTICLES

(71) Applicant: FEI Company, Hillsboro, OR (US)

(72) Inventor: Ondrej Shanel, Vrbno pod Pradedem (CZ)

(73) Assignee: FEI COMPANY, Hillsboro, OR (US)

( * ) Notice: Subject to any disclaimer, the term of this patent is extended or adjusted under 35 U.S.C. 154(b) by 411 days.

(21) Appl. No.: 14/333,174

(22) Filed: Jul. 16, 2014

(65) Prior Publication Data

US 2015/0021476 A1 Jan. 22, 2015

(30) Foreign Application Priority Data

Jul. 18, 2013 (EP) ..................................... 13176980

(51) Int. Cl.
| | | |
|---|---|---|
| *H01J 37/00* | (2006.01) | |
| *G21K 1/093* | (2006.01) | |
| *H01J 37/26* | (2006.01) | |
| *H01J 37/141* | (2006.01) | |
| *H01F 3/10* | (2006.01) | |

(52) U.S. Cl.
CPC ............ *G21K 1/093* (2013.01); *H01J 37/141* (2013.01); *H01J 37/26* (2013.01); *H01F 2003/106* (2013.01); *H01J 2237/1415* (2013.01); *H01J 2237/26* (2013.01); *Y10T 29/4978* (2015.01)

(58) Field of Classification Search
USPC ...................... 250/396 R, 398, 400, 396 ML
See application file for complete search history.

(56) References Cited

U.S. PATENT DOCUMENTS

| | | | |
|---|---|---|---|
| 2,305,761 | A | 12/1942 | Borries et al. |
| 2,681,421 | A | 6/1954 | Gethmann |
| 3,736,423 | A | 5/1973 | Katagiri et al. |
| 3,984,687 | A | 10/1976 | Loeffler et al. |
| 4,468,563 | A | 8/1984 | Tsuno et al. |
| 4,525,629 | A | 6/1985 | Morita et al. |
| 5,268,579 | A | 12/1993 | Bleeker et al. |
| 6,320,194 | B1 | 11/2001 | Khursheed et al. |
| 6,852,982 | B1 | 2/2005 | Bierhoff et al. |
| 7,067,820 | B2 | 6/2006 | Buijsse |

FOREIGN PATENT DOCUMENTS

GB 521439 5/1940

*Primary Examiner* — Nicole Ippolito
*Assistant Examiner* — Hanway Chang
(74) *Attorney, Agent, or Firm* — Scheinberg & Associates, P.C.; Michael O. Scheinberg

(57) ABSTRACT

A magnetic lens for focusing a beam of charged particles traveling along an optical axis includes
  an axial bore disposed around said optical axis;
  magnetic field generating means; and
  magnetic yoke, to guide and concentrate said magnetic field toward said optical axis so as to form a focusing region,
wherein
  Said yoke has a composite structure, comprising an outer primary portion and an inner secondary portion;
  Said secondary portion is mounted as a monolithic insert within said primary portion so as to be disposed around said focusing region;
  Said secondary portion comprises a waist region surrounding said bore and acting as a magnetic constriction, configured such that said magnetic field undergoes saturation in said waist region, thereby causing magnetic flux to exit the waist region and form a focusing field in said focusing region.

20 Claims, 5 Drawing Sheets

MAGNETIC LENS FOR FOCUSING A BEAM OF CHARGED PARTICLES

Figure 1:
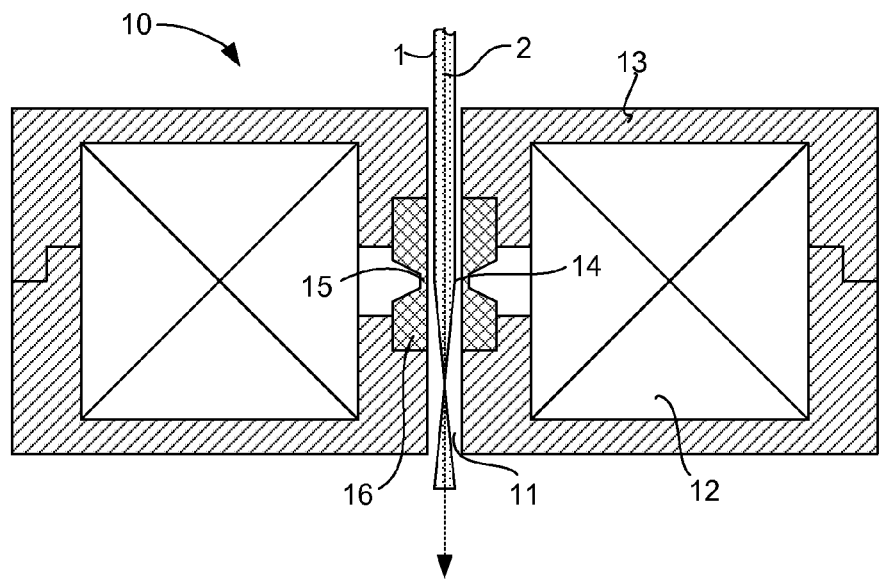

The invention relates to magnetic lens for focusing a beam of charged particles traveling along an optical axis, the lens comprising:

An axial bore disposed around said optical axis, to accommodate said beam;

Magnetic field generating means, for generating a magnetic field; and

A magnetic yoke, to guide and concentrate said magnetic field toward said optical axis so as to form a focusing region for said beam.

The invention also relates to a method of focusing a beam of charged particles using such a magnetic lens.

The invention additionally relates to a method of manufacturing such a magnetic lens.

The invention further relates to a charged-particle microscope comprising:

A charged-particle source, for producing an irradiating beam of charged particles that propagate along an optical axis;

A sample holder, for holding a sample to be irradiated;

A particle-optical column, for directing said beam onto said sample;

A detector, for detecting a flux of output electrons emanating from the sample in response to said irradiation, wherein said particle-optical column comprises at least one magnetic lens as set forth in the opening paragraph above.

A magnetic lens as set forth in the opening paragraph above is known, for instance, from conventional electron microscopy, and is described, for example, in "Scanning Electron Microscopy", by L. Reimer, Springer Verlag (1985), ISBN 3-540-13530-8, more specifically from chapter 2.2.1: Electron lenses (pages 20-23).

Reimer describes a magnetic lens with an electric coil for generating a magnetic field and a pair of iron pole pieces (comprising the yoke), the pole pieces concentrating the magnetic field to a rotationally symmetric axial field on a symmetry axis of the lens. Charged particles (electrons) travelling through this axial field are subject to the Lorentz force and consequently experience a focusing effect. The pair of poles pieces are arranged so as to face each other across an intervening "air gap", which is traversed by magnetic field lines from the pole pieces when said electric coil is excited (invoked). Although conventionally referred to as an "air gap", such a gap may, in fact, be vacuous, or may be filled with non-magnetic material.

The strength of the lens (its focal length) is a function of its excitation (electrical current and number of turns in said electric coil) and the mass and energy of the charged particles being focused. Magnetic lenses are typically used for focusing electrons, whereas electrostatic lenses are often preferred for focusing ions.

As is known to the skilled artisan, the pole pieces in such a magnetic lens must be well aligned across the intervening air gap. If the pole pieces are misaligned, i.e. the symmetry (cylindrical) axis of one pole piece does not coincide with the symmetry (cylindrical) axis of the other pole piece, then the resultant lens axis will be undesirably skewed, leading to dysfunctional focusing action. So as to facilitate proper alignment and performance, such pole pieces typically need to be manufactured to tight mechanical tolerances—often of the order of 10 μm or less—as a result of which these pole pieces tend to be relatively expensive parts. A complication to that is that the magnetic material comprised in the pole pieces should ideally have a relatively low hysteresis; to achieve this, said material is typically annealed, which limits subsequent machinability of the pole pieces (e.g. with lathes and milling machines).

Another problem with conventional lenses is that the air gap between the pole pieces also (unwantedly) passes stray magnetic fields perpendicular to the optical axis. Such perpendicular fields (including 50 Hz magnetic fields) can undesirably influence the beam passing through the lens, and can be an additional source of skew.

For more information about magnetic material, general reference is made to the German-language publication "Weichmagnetische Werkstoffe", by R. Boll, Vacuumschmelze GmbH & Co. KG, ISBN 3-80090154604.

It is an object of the invention to address these issues. In particular, it is an object of the invention to provide a magnetic lens design that allows more accurate and easier alignment of component parts. Moreover, it is an object of the invention that such a design should lend itself to easier machining of critical parts, leading to lowered manufacturing costs. In addition, it is an object of the invention to provide a magnetic lens design with reduced susceptibility to perpendicular stray magnetic fields, leading to with improved particle-optical characteristics.

These and other objects are achieved in a magnetic lens as set forth in the opening paragraph above, which is characterized according to the invention in that:

Said yoke has a composite structure, comprising an outer primary portion and an inner secondary portion;

Said secondary portion is mounted as a monolithic insert within said primary portion so as to be disposed around said focusing region;

Said secondary portion comprises a waist region surrounding said bore and acting as a magnetic constriction, configured such that said magnetic field undergoes saturation in said waist region, thereby causing magnetic flux to exit the waist region and form a focusing field in said focusing region.

The invention is based on a number of synergistic insights, as follows:

Use of an air gap between two opposed pole pieces is the traditional way of forcing magnetic flux to break out of a yoke and into a region where it is to produce a focusing effect. However, the existence of such an air gap de facto requires the existence of two pole pieces—with the attendant difficulty of accurately aligning their longitudinal axes.

The present invention adopts a radically different mechanism to this traditional set-up. Instead of using an air gap, the yoke is provided at the focusing region with a magnetic constriction (a waist), which becomes magnetically saturated when it is permeated by a magnetic field from the lens' magnetic field generating means. As a result of such magnetic saturation within the constriction, magnetic flux is forced to break out of the yoke at that location (since there is nowhere else for it to go). This emergent flux is then exploited to produce the desired focusing effect/field within the bore (syn. shaft, tunnel, passage), which is typically disposed along a cylindrical axis of the lens.

Because there is no air gap in the new design, there is no need for two opposing pole pieces. Instead, a monolithic design becomes possible—thus obviating the need to mutually align two pole pieces. Put another way: whereas a prior-art "focusing structure" comprised two, separate pole pieces that were aligned relative to one another across an intervening air gap, the inventive "focusing structure" comprises a single component, with a waist instead of an air gap.

To facilitate manufacture, the yoke is given a composite structure, comprising:

A relatively large primary portion, manufactured to relatively low tolerances and typically comprising the bulk of the yoke, situated distal the (relatively critical) focusing region. This primary portion can, if desired, comprise a plurality of cooperating sub-components.

A relatively small, monolithic secondary portion, manufactured to relatively high tolerances, situated vicinal the (relatively critical) focusing region. This secondary portion can be fully manufactured ex situ, and then mounted as a single insert within (a seating structure provided in) the primary portion.

These primary and secondary portions will typically comprise different materials.

The breakout (escape) of flux from the saturated waist can be exploited to produce a symmetric axial focusing field. Since there is no air gap in the inventive design, the stray magnetic fields referred to above are obviated. Because the material surrounding the focusing region will typically saturate in the axial direction only, the permeability $\mu_r$ perpendicular to the axial direction will be high—producing much greater shielding than in conventional lenses employing an air gap.

It is noted that, although it might seem to be a relatively simple design feature to replace the air gap in a magnetic lens by a waist region that undergoes magnetic saturation, it is not something obvious to the skilled artisan, inter alia for the following reasons:

Deliberately saturating a portion of the yoke (as in the present invention) causes a phenomenon whereby, when using the lens at a high excitation, the volume of saturated material will be larger than when using the lens at a low excitation; when translated to the case of a conventional lens (with an air gap), one can think of such a change as being equivalent to a dimensional change in the air gap, with an attendant change in lens strength as a function of excitation. In a conventional lens, increasing charged-particle energy by a factor of four will predictably require the lens excitation/current to be increased by a factor of two, in order to produce the same focusing effect; however, in a lens using saturated material according to the invention, unpredictable deviation from this simple functional dependence may be expected, due to the above-mentioned volume change effect.

Nowadays, magnetic lens design is usually done with the aid of simulation-based Finite Element Modeling (FEM). In modern FEM programs, for each of the elements (corresponding to voxels) in a given simulation, a value of $\mu_r$ (see above) is calculated in successive iterations. As more voxels become increasingly saturated, the attendant number of iterations increases sharply. Consequently, lens designers tend to be biased toward lens designs that are relatively poor in saturated material.

In a lens according to the present invention, one tends to need more ampere-turns (in a coil being used as magnetic field generating means) to produce a given (magnetic) focusing field than in the case of a conventional lens. This is because, in the inventive lens, a certain amount of coil current is used to saturate the material in the waist region without causing an attendant axial magnetic field; in contrast, in conventional lenses, this same amount of current is readily available to generate a magnetic field in the gap, thus contributing to the axial magnetic field.

Designers of charged-particle microscopes have thus traditionally had several reasons to keep the amount of magnetically saturated material as low as possible, e.g. limited to the edges defining the air gap. Such a tendency points strongly away from the present invention.

Surprisingly, the inventor has found that the deliberate incorporation of a (waist) region with magnetically saturated material tends to result in a smoother axial field change (lower dB/dz, where B is magnetic field and z is measured along the optical axis), resulting in lower lens aberrations compared to prior-art lenses with a similar-sized focusing region. This is a result of a more gradual break-out of magnetic flux from the saturated material as compared to the abrupt step that is made at the yoke/air-gap boundary in a prior-art lens.

Figure 2:
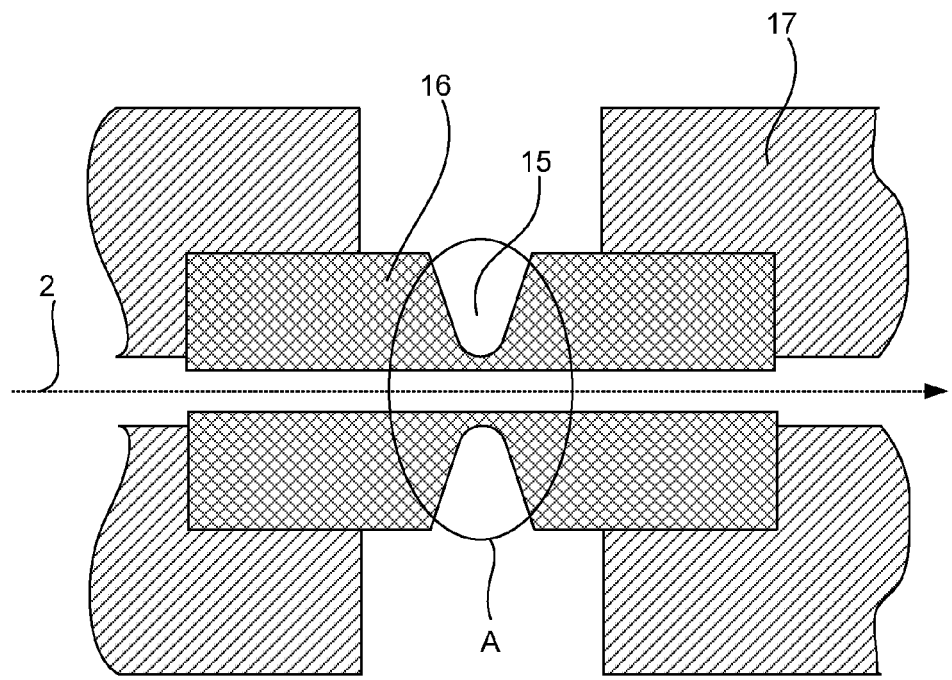

Typically, the secondary portion will have an "hourglass" shape (or a shape similar thereto), with a gradual transition from a relatively large diameter (at one end), to a relatively small diameter (at the waist), and back to a relatively large diameter (at the other end); see FIG. 2, for example. However, this does not necessarily have to be the case, and a more step-like transition from a larger to a smaller diameter is also conceivable; see FIG. 3, for example. The secondary portion will typically have a circular cross-section (viewed perpendicular to the particle-optical axis/bore), and will typically be symmetric in longitudinal cross-section. The primary portion of the yoke will typically have hollows/cavities/sockets into which the ends of the secondary portion can be fitted and fixed.

In an embodiment of the current invention, said magnetic field generating means are selected from the group comprising electric coils, permanent magnets, and combinations hereof.

Lenses based on permanent magnets are well known, and have the advantage that they need consume no electrical power in use. Lenses employing electric coils tend to be used more often, as they allow an adjustment in field strength (and thus particle-optical behavior) via adjustment of the electrical current sent through the coil(s) in question. A combination of both these approaches allows a lens in which most of the magnetic field can be generated by the employed permanent magnets, while a variation of this field (to higher or lower levels) can be achieved by appropriate excitation of the accompanying electrical coil(s).

In another embodiment, said primary and secondary portions comprise different magnetic materials.

In such an embodiment, only a relatively small part of the yoke (said secondary portion) need be comprised of high-quality magnetic material, machined to a high accuracy and annealed to the highest magnetic standards, while other parts of the yoke (said primary portion) can comprise materials of lower grade, with relaxed tolerances, magnetic quality and/or annealing standards—resulting in a composite yoke that is cheaper and easier to manufacture.

In yet another embodiment, at least the secondary portion of the yoke comprises magnetic material selected from the group comprising ferromagnetic material, ferrite, and combinations hereof.

Examples of (low-hysteresis) ferromagnetic materials include (in pure form or as alloys) Fe, Co and Ni, and these may be supplemented by traces of, for example, Cu, Mo, Si, Va, and/or Cr.

Ferrites (comprising iron oxides) also lend themselves to such use: see, in this regard: http://en.wikipedia.org/wiki/Ferrite %28magnet %29

In another embodiment, the inventive magnetic lens further comprises an auxiliary electric coil that is disposed proximal said waist region and that can be invoked to produce an auxiliary magnetic field in said magnetic constriction, thereby allowing adjustment of said focusing field.

The basic idea behind this embodiment is that the auxiliary magnetic field produced by the auxiliary electric coil will (depending on field direction) produce localized (and controllable) strengthening or weakening of the magnetic flux in the waist region, thereby influencing the degree of saturation in said region, and thus also influencing the degree of break-out of flux from said region, which correspondingly influences the focusing field occurring in the focusing region. The skilled artisan will appreciate that, in some cases, it is desirable to be able to make rapid adjustments to the strength of a lens. In prior-art lenses, such adjustment required the use of an adjustment coil located in the bore of the lens—which, for several reasons, tends to be undesirable, e.g. because of problems related to cooling, accessibility/servicing, etc. By instead placing an auxiliary coil outside the vacuum barrier (bore), such problems are avoided. The current embodiment uses such an external auxiliary coil, located near/at an external surface of the secondary yoke portion (insert) at/vicinal the waist region; for example, the coil may surround the waist region somewhat like a belt.

Because the inductance of such an auxiliary electric coil will tend to be lower than the inductance of a similar electrical coil surrounding non-saturated material, an auxiliary coil as described above allows high-frequency changes to be made to the strength of the lens.

In yet another embodiment of the invention, at least one additional particle-optical element is provided within said bore, which additional element is selected from the group comprising deflection elements, detection elements, electrostatic lens elements, multipole elements, correctors, auxiliary lenses, and combinations hereof.

In the relatively cramped optical column of a charged-particle microscope (such as a SEM, TEM, STEM, FIB-SEM, ion microscope or proton microscope, for example), it is quite common to have many additional particle-optical elements located in the bore. For example, a set of deflectors can be disposed in the bore so as to effect positioning/scanning motion of the charged-particle beam relative to the surface of a specimen on a specimen holder (see FIG. 7, for instance).

In a particular embodiment, the occurrence of magnetic saturation as specified above (in the waist region) leads to a reduction in incremental permeability $\mu_\Delta$ in the direction of said focusing field to at most 10% of a maximum attainable incremental permeability $\mu_{\Delta max}$, and preferably to at most 1% of $\mu_{\Delta max}$.

By defining saturation in terms of incremental permeability $\mu_\Delta = \delta B/\delta H$ (where H is magnetic field strength), and by stipulating $\mu_{\Delta sat} < \mu_{\Delta max}/10$—and preferably $\mu_{\Delta sat} < \mu_\Delta/100$—at a magnetic field above the magnetic field value at which $\mu_{\Delta max}$ occurs, an objective value can be ascribed to saturation, instead of the often-used definition of "asymptotic value".

In another embodiment, the lens forms a vacuum seal with other components arranged along the optical axis.

Such an embodiment provides a simple yet effective way of stacking such components together, e.g. along the particle-optical axis of an electron microscope. Aligning the various stacked components can be done using, for example, a principle such as that described in Dutch patent number NL 1025037.

It is noted that magnetic materials often change dimensions when magnetized, due to an effect known as magnetostriction; conversely, stress/strain on a magnetic material can affect its magnetic properties. In view of this, it is generally desirable to avoid undue pressure/stain in the secondary yoke portion (insert) when mounting it within the primary yoke portion.

As a final remark, it should be noted that the term "monolithic" as applied to the secondary yoke portion (insert) is intended to imply that the insert in its most basic form—e.g. without an auxiliary coil as alluded to above, or any mounting structure used to place/align/affix it within the primary yoke portion—is a one-piece component. This does not necessarily mean that a structure from which it is manufactured cannot be composite: for example, one could envisage machining the secondary insert from a workpiece with a laminated structure, or one might coat the insert with a thin film after manufacture, etc. The term "monolithic" is principally intended to distinguish from the prior-art situation in which two separate, individual, independent pole pieces are positioned on either side of an air gap.

The invention will now be elucidated with the aid of Embodiments and the accompanying schematic drawings, in which:

FIG. 1 schematically shows an embodiment of a magnetic lens according to the invention.

FIG. 2 schematically shows a detail of FIG. 1, comprising the insert (secondary yoke portion).

Figure 3:
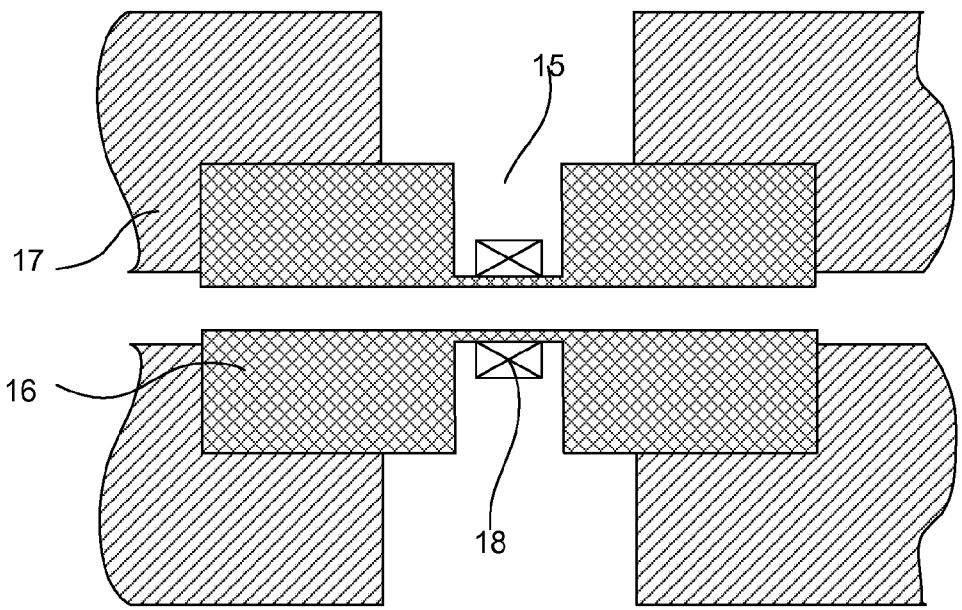

FIG. 3 schematically shows a detail of FIG. 1, comprising the insert together with an auxiliary electric coil.

Figure 4:
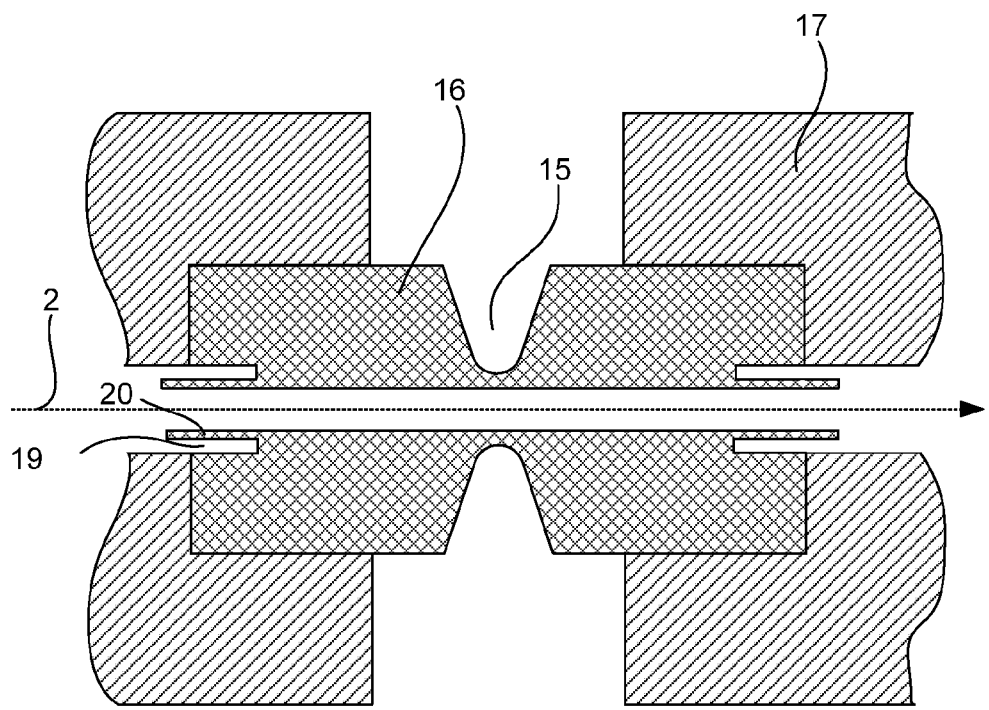

FIG. 4 schematically shows a detail of FIG. 1, comprising an alternative insert (secondary yoke portion).

Figure 5:
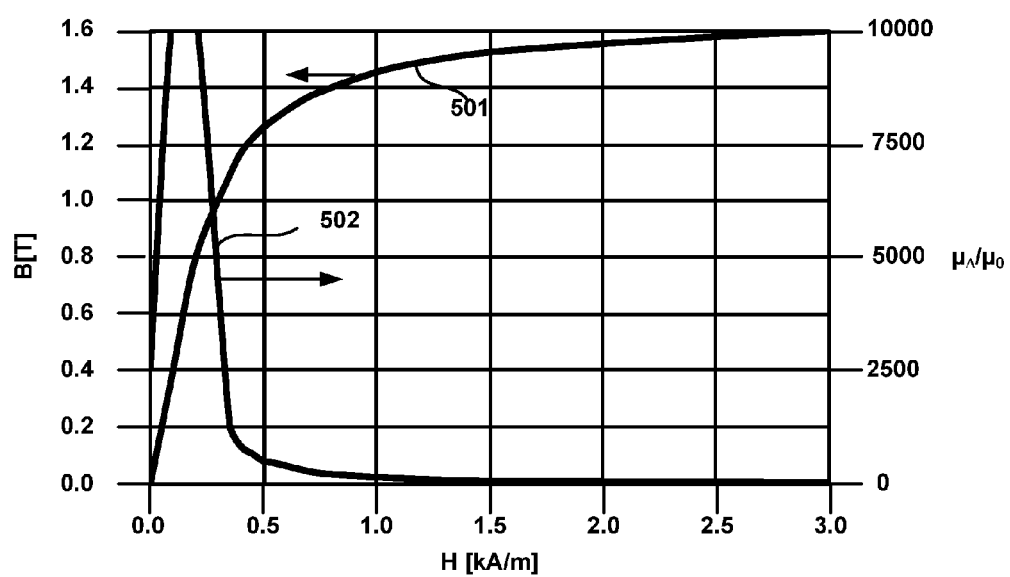

FIG. 5 schematically shows the relation between B(H) and $\mu_r(H)$ (magnetic field and permeability as a function of magnetic field strength).

Figure 6:
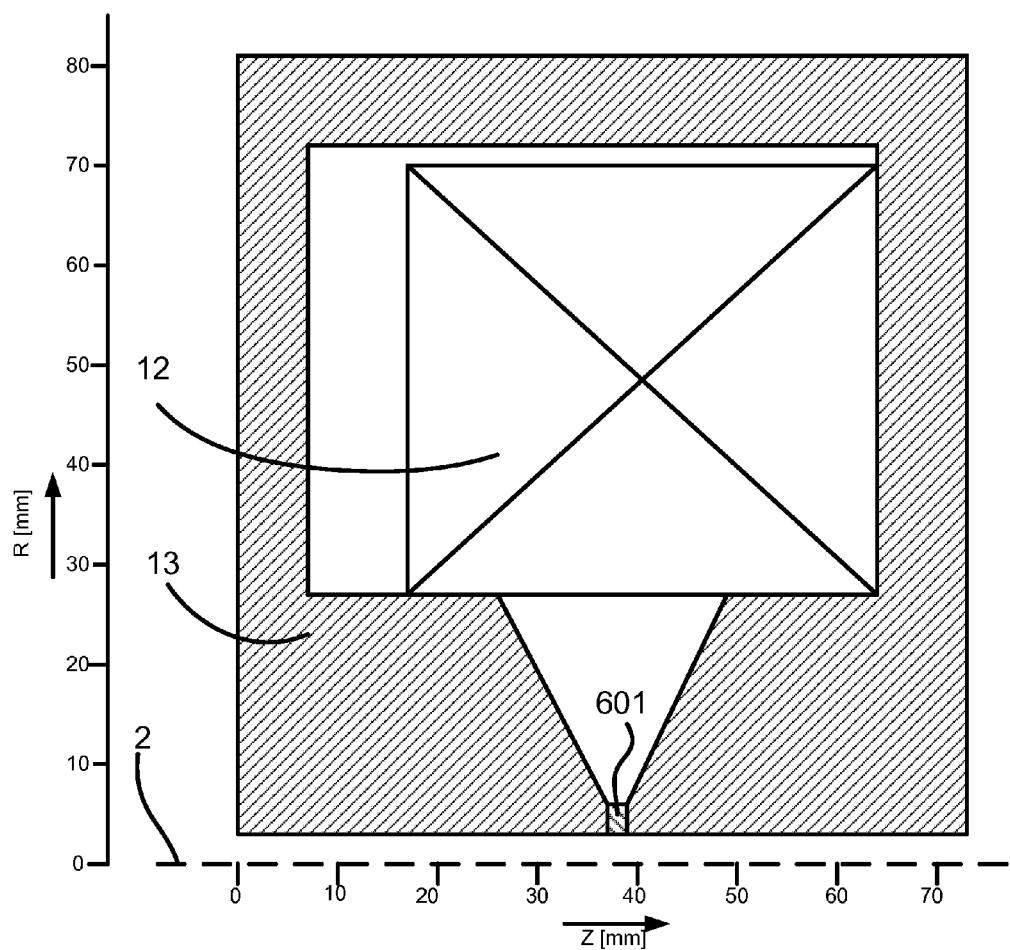

FIG. 6 schematically shows a lens design used in two simulations—one of which is based on a prior-art lens, and the other of which is based on an embodiment of a lens according to the present invention.

Figure 7:
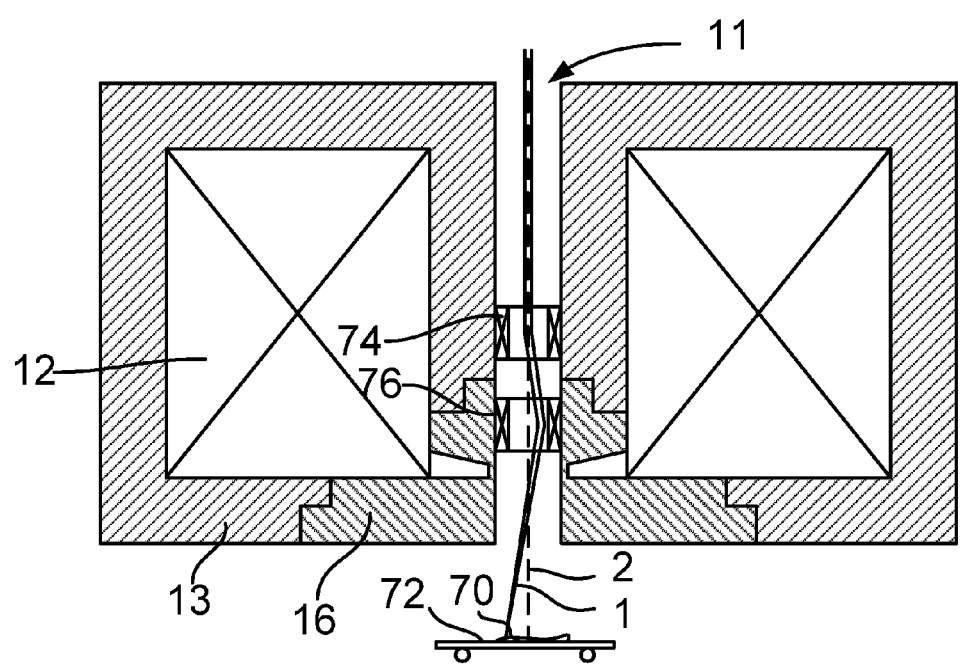

FIG. 7 shows an objective lens as employed in a Scanning Electron Microscope (SEM).

In the Figures, where relevant, identical reference symbols indicate corresponding features.

EMBODIMENT 1

FIG. 1 schematically shows a cross-sectional view of a (rotationally symmetric) magnetic lens 10 according to an embodiment of the present invention.

A beam 1 of charged particles (e.g. electrons) travels along an optical axis 2. Round the optical axis 2 are provided a composite magnetic yoke 13, 16 and an electric coil (magnetic field generating means) 12. The magnetic yoke 13 includes a central (axial) bore 11, and comprises an outer primary portion 13 and an inner secondary portion 16, the latter (16) being mounted as a monolithic insert within the former (13). The secondary portion 16 comprises a waist region 15 (of reduced outer diameter) surrounding said bore 11 and acting as a magnetic constriction. In operation (when the coil 12 is powered up), this waist region 15 is magnetically saturated, as a result of which an axial magnetic (focusing) field is formed in focusing region 14. Secondary portion 16, and particularly waist region 15, is of a high magnetic quality, whereas the primary portion 13 of the yoke can be of a lower magnetic quality, e.g. because it comprises material with a different (magnetically inferior) composition, has undergone a different annealing and/or machining process, etc.

FIG. 2 schematically shows a detail of FIG. 1, comprising the secondary yoke portion (insert) 16. FIG. 2 is turned on its side relative to FIG. 1.

The secondary portion/insert 16 sits into a suitably tailored cavity/socket in a "butt end" 17 of the primary yoke portion 13, and comprises a waist region 15 with reduced outer diameter. Because this waist region 15 is relatively narrow, it forms a magnetic constriction for flux within the yoke 13, 16, and saturates much earlier than adjacent parts of the yoke.

As saturation behavior is mainly governed by the material within illustrated zone A, only the bore and diameters in zone A need to be machined to a high accuracy. The magnetic properties of material outside zone A are of less importance, particularly the quality of the "inferior" magnetic part 13.

EMBODIMENT 2

FIG. 3 schematically shows a lens 10 with a secondary portion (insert) 16 and an auxiliary electric coil 18 for performing high-frequency lens modulation.

The Figure shows a secondary portion/insert 16 with a waist portion 15. Proximal (in this case surrounding) the waist portion 16 is an auxiliary electric coil 18. During lens operation, the auxiliary coil 18 will thus surround saturated material and, as a result, the inductance of the coil 18 will be relatively low, allowing lens strength to be varied with a relatively high frequency. For an axial field along the optical axis 2, no shielding due to eddy currents occurs.

EMBODIMENT 3

FIG. 4 schematically shows a detail of FIG. 1, comprising an alternative secondary portion/insert 16.

Here, the insert 16 comprises a groove 19, causing a peninsular part 20 to be isolated from the rest of the yoke (13, 16). Because such a peninsular part is magnetically "free-standing", it shields the axial region from stray magnetic fields. Preferably, the free-standing peninsular part of the insert extends beyond the joints where the insert 16 is seated upon the rest (13, 17) of the yoke, thus avoiding an unwanted break-out of the magnetic field at said joints.

EMBODIMENT 4

FIG. 5 schematically shows a B-H curve of a ferromagnetic material and the incremental permeability $\mu_\Delta = \delta B/\delta H$.

B, the magnetic field strength in Tesla, is the result of H, expressed in A/m. The relationship between the two is $B = \mu H = \mu_0 \mu_r H$ ($\mu_0$ = permeability of vacuum/air; $\mu_r$ = relative permeability). The curve shown is exemplary for pure (99.98%) Fe, also known as magnet iron. As seen in this curve, the material saturates at a field strength of approximately 1.5 T, and, as known to the skilled artisan, a well-annealed piece of pure iron has a maximum $\mu_r$ of ca. 40000. For completely saturated material, the field B still increases, but the derivative $\delta B/\delta H$ then equals $\mu_0$, identical to air/vacuum. The derivative $\delta B/\delta H$ is also known as the incremental permeability $\mu_\Delta$.

For practical reasons, "saturated" can be defined here as the field strength B for which $\mu_\Delta$ equals $\mu_{\Delta max}/10$, more preferably $\mu_{\Delta max}/100$ (see above).

EMBODIMENT 5

FIG. 6 schematically shows a lens design used in two simulations.

FIG. 6 shows half of a lens, the lens being rotationally symmetric round the optical axis 2 (r indicates radius from this axis). The lens comprises a yoke 13 and a coil 12 to magnetize the yoke. The material used in the simulation is pure iron, with the BH curve and $\mu_\Delta$ shown in FIG. 5. The difference between said two simulations is that:
In the first simulation, part 601 is absent, thus representing a prior-art lens with an air gap.
In the second simulation, part 601 is made of the same pure iron as used in the rest of the simulated yoke 13. Part 601 then forms the waist region/magnetic constriction stipulated by the invention.

In the first simulation—for a lens with an air gap—the excitation (NI) of the lens, 3133 Ampere turns (A.t), is chosen to result in a focal length ($F_{obj}$) of 7.27 mm. In the second simulation—for a lens according to the invention, without an air gap—another excitation is chosen, namely 3548 Ampere turns, as a result of which the focal length for both simulations is the same.

As known to the skilled artisan in the art of (charged optical) lens design, the spherical aberration Cs and the chromatic aberration Cc are important parameters for such lenses. In general, the lower these aberrations, the better. Simulations show the following characteristics:

TABLE 1 simulated lens characteristics for the lens shown in FIG. 6

|  | $F_{obj}$ [mm] | NI [A·t] | Cs [mm] | Cc [mm] |
| --- | --- | --- | --- | --- |
| With air gap | 7.27 | 3133 | 22.9 | 6.4 |
| Without air gap | 7.27 | 3548 | 14.9 | 6.2 |

The observed improvement of ca. 35% in spherical aberration is a large improvement, and results—for a spot that is limited by spherical aberration—in (for example):
A doubling in current density in the same spot diameter; or
A 35% decrease in spot size for the same spot current.

EMBODIMENT 6

FIG. 7 shows an objective lens as used in a Scanning Electron Microscope. Here, the focusing area is close to one end (bottom end) of the lens.

The lens comprises a composite yoke having a primary portion 13 and a secondary portion (insert) 16. In the yoke, a coil 12 is placed for magnetizing said primary and secondary portions 13, 16. Inside a bore 11, two deflectors 74 and 76 are placed for the purpose of manipulating/positioning charged particle beam 1 upon a sample 70. The sample 70 is placed on a sample manipulator 72. As is known to the skilled artisan, a pair of deflectors (74, 76) can be satisfactorily used to steer the charged-particle beam 1 away from the optical axis 2 (extending along a direction Z) and move/scan it (in an XY plane) across the surface of sample 70. Other optical components, such as stigmators or detectors, may be placed in the bore as well, though such components are not shown here.

It is noted that this document makes multiple references to charged particles. The term "charged particles" may comprise electrons, ions, and charged molecules, for example. However, the use of magnetic lenses is especially useful when manipulating electrons, due to their mass/charge ratio. Nevertheless, use of the inventive lens with ions, particularly beams of hydrogen and/or helium ions, is also feasible.

It is also noted that a beneficial effect of the invention is that the power dissipation of lenses according to the invention is more constant than for prior-art lenses—since, in inventive lenses, part of the (coil) power is needed just to attain the desired localized saturation (in the waist region). This implies that a "zero load" must always be used to saturate the yoke, with the rest of the power being used to cause the desired axial magnetic field.

In conclusion, prior-art magnetic charged-particle lenses make use of a yoke with an air gap. The air gap defines the position where a magnetic field is created on the optical axis of the lens. A lens (10) according to the current invention has no air gap, and instead exploits magnetic saturation effects in a monolithic yoke insert portion (16). This results in a lens with lower spherical aberration, due to a more gradual break-out of magnetic flux from the yoke. Moreover, it eliminates the misalignment problems that prior-art lenses suffer from when trying to align upper and lower pole pieces across an air gap. Because, in the invention, the (waist) part of the yoke undergoing saturation is a relatively small insert (16), it can be manufactured to better tolerances, can be more easily machined, and can generally be made at reduced cost relative to the prior art. Typically, the insert (16) will have magnetic properties different from the rest (13) of the yoke.

I claim:

1. A magnetic lens for focusing a beam of charged particles traveling along an optical axis, the lens comprising:
   an axial bore disposed around said optical axis, to accommodate said beam;
   magnetic field generating means, for generating a magnetic field; and
   a magnetic yoke, to guide and concentrate said magnetic field toward said optical axis so as to form a focusing region for said beam,
   wherein:
   yoke has a composite structure, comprising an outer primary portion and an inner secondary portion;
   secondary portion is mounted as a monolithic insert within said primary portion so as to be disposed around said focusing region;
   secondary portion comprises a waist region surrounding said bore and acting as a magnetic constriction, configured such that said magnetic field undergoes saturation in said waist region, thereby causing magnetic flux to exit the waist region and form a focusing field in said focusing region.

2. A magnetic lens according to claim 1, wherein said magnetic field generating means are selected from the group comprising electric coils, permanent magnets, and combinations hereof.

3. A magnetic lens according to claim 1, wherein said primary and secondary portions comprise different magnetic materials.

4. A charged-particle microscope comprising:
   a charged-particle source, for producing an irradiating beam of charged particles that propagate along an optical axis;
   a sample holder, for holding a sample to be irradiated;
   a particle-optical column, for directing said beam onto said sample;
   a detector, for detecting a flux of output electrons emanating from the sample in response to said irradiation,
   wherein said particle-optical column comprises at least one magnetic lens as claimed claim 3.

5. A magnetic lens according to claim 1, wherein said secondary portion comprises magnetic material selected from the group comprising ferromagnetic material, ferrite, and combinations hereof.

6. A magnetic lens according to claim 5, wherein said secondary portion has a substantially hourglass shape.

7. A magnetic lens according to claim 1, comprising an auxiliary electric coil that is disposed proximal said waist region and that can be invoked to produce an auxiliary magnetic field in said magnetic constriction, thereby allowing adjustment of said focusing field.

8. A charged-particle microscope comprising:
   a charged-particle source, for producing an irradiating beam of charged particles that propagate along an optical axis;
   a sample holder, for holding a sample to be irradiated;
   a particle-optical column, for directing said beam onto said sample;
   a detector, for detecting a flux of output electrons emanating from the sample in response to said irradiation,
   wherein said particle-optical column comprises at least one magnetic lens as claimed claim 7.

9. A magnetic lens according to claim 1, wherein, provided within said bore is at least one additional particle-optical element selected from the group comprising deflection elements, detection elements, electrostatic lens elements, multipole elements, correctors, auxiliary lenses, and combinations hereof.

10. A magnetic lens according to claim 1, wherein said magnetic saturation reduces an incremental permeability $\mu\Delta$ in the direction of said focusing field to at most 10% of a maximum attainable incremental permeability $\mu\Delta max$, and preferably to at most 1% of $\mu\Delta max$.

11. A charged-particle microscope comprising:
   a charged-particle source, for producing an irradiating beam of charged particles that propagate along an optical axis;
   a sample holder, for holding a sample to be irradiated;
   a particle-optical column, for directing said beam onto said sample;
   a detector, for detecting a flux of output electrons emanating from the sample in response to said irradiation,
   wherein said particle-optical column comprises at least one magnetic lens as claimed claim 1.

12. A method of focusing a beam of charged particles traveling along an optical axis, using a magnetic lens comprising:
   an axial bore disposed around said optical axis, to accommodate said beam;
   Magnetic field generating means, for generating a magnetic field; and
   a magnetic yoke, to guide and concentrate said magnetic field toward said optical axis so as to form a focusing region for said beam,
   wherein the method comprises:
   providing said yoke as a composite structure, comprising an outer primary portion and an inner secondary portion;
   providing said secondary portion as a monolithic insert mounted within said primary portion so as to be disposed around said focusing region and comprising a waist region surrounding said bore and acting as a magnetic constriction;
   invoking said magnetic field generating means to produce a saturated magnetic field in said waist region, thereby causing magnetic flux to exit the waist region and form a focusing field in said focusing region;

using said focusing field to focus said beam of charged particles.

13. A focusing method according to claim 12, comprising the following additional steps:

providing an auxiliary electric coil proximal said waist region;

invoking said auxiliary electric coil so as to produce an auxiliary magnetic field in said magnetic constriction;

varying said auxiliary magnetic field so as to adjust said focusing field.

14. The method of claim 12 in which the said primary and secondary portions comprise different magnetic materials.

15. The method of claim 12 in which said secondary portion comprises magnetic material selected from the group comprising ferromagnetic material, ferrite, and combinations hereof.

16. The method of claim 12 wherein said secondary portion has a substantially hourglass shape.

17. The method of claim 12 in which the magnetic lens includes an auxiliary electric coil that is disposed proximal said waist region and further comprising adjusting said focusing field using the auxiliary electric coil to produce an auxiliary magnetic field in said magnetic constriction.

18. The method of claim 12 further comprising adjusting the beam using at least one additional particle-optical element selected from the group comprising deflection elements, detection elements, electrostatic lens elements, multipole elements, correctors, auxiliary lenses, and combinations hereof.

19. A method of manufacturing a magnetic lens for focusing a beam of charged particles traveling along an optical axis, which lens comprises:

an axial bore disposed around an optical axis, to accommodate said beam;

magnetic field generating means, for generating a magnetic field; and a magnetic yoke, to guide and concentrate said magnetic field toward said optical axis so as to form a focusing region for said beam, the method comprising:

manufacturing a primary portion of said yoke;

manufacturing a secondary portion of said yoke as a monolithic component comprising a waist region surrounding said bore and acting as a magnetic constriction;

aligning and mounting said secondary portion as an insert within said primary portion, so that said secondary portion is disposed around said focusing region, whereby, during manufacture, at least part of said secondary portion is machined to higher precision than said primary portion.

20. The method of claim 19 in which said primary portion and said secondary portion are manufactured from different magnetic materials.

* * * * *